United States Patent
Remington, Jr.

(10) Patent No.: US 6,521,295 B1
(45) Date of Patent: Feb. 18, 2003

(54) CHEMICAL VAPOR DEPOSITION OF ANTIMONY-DOPED METAL OXIDE AND THE COATED ARTICLE MADE THEREBY

(75) Inventor: Michael P. Remington, Jr., Perrysburg, OH (US)

(73) Assignee: Pilkington North America, Inc., Toledo, OH (US)

( * ) Notice: Subject to any disclaimer, the term of this patent is extended or adjusted under 35 U.S.C. 154(b) by 44 days.

(21) Appl. No.: 09/836,647

(22) Filed: Apr. 17, 2001

(51) Int. Cl.⁷ .............................................. C23C 16/90
(52) U.S. Cl. ............................ 427/255.19; 427/255.32; 65/60.52
(58) Field of Search ....................... 427/255.19, 255.32; 65/60.52

(56) References Cited

U.S. PATENT DOCUMENTS

| | | |
|---|---|---|
| 4,293,594 A | 10/1981 | Yoldas et al. |
| 4,377,613 A | 3/1983 | Gordon |
| 4,828,880 A | 5/1989 | Jenkins et al. |
| 6,110,597 A | 8/2000 | Fujisawa |

FOREIGN PATENT DOCUMENTS

| | | | |
|---|---|---|---|
| GB | 2 302 102 A | | 1/1997 |
| GB | 2302102 | * | 1/1997 |
| JP | 8109042 | | 4/1996 |

OTHER PUBLICATIONS

Remington, Michael P. Jr., et al., Growth of antimony thin films using perbenzylated organometallic precursors Proceedings of the 1998 Materials Research Society Fall Meeting—Symposium on Solid–State Chemistry of Inorganic Materials II, Boston, MA USA Nov. 30–Dec. 4, 1998, vol. 547, pp. 481–485 (Abstract attached) (abstract Only).

* cited by examiner

Primary Examiner—Timothy Meeks
(74) Attorney, Agent, or Firm—Marshall & Melhorn, LLC

(57) ABSTRACT

Antimony doped tin oxide coatings on glass are prepared by providing a uniform, vaporized reactant mixture containing an organotin compound, an organoantimony compound, water and oxygen, and delivering the reactant mixture to the surface of the hot ribbon of glass, where the compounds react to form an antimony doped tin oxide coating. The antimony doped tin oxide coatings applied in accordance with the invention exhibit improved uniformity in thickness and sheet resistance over the coated surface of the glass, and increased coating/manufacturing efficiency.

17 Claims, No Drawings

CHEMICAL VAPOR DEPOSITION OF ANTIMONY-DOPED METAL OXIDE AND THE COATED ARTICLE MADE THEREBY

FIELD OF THE INVENTION

The present invention relates generally to a method for forming a metal oxide coating on glass, and more particularly, to a process for preparing a tin oxide coating doped with antimony on a hot glass substrate by chemical vapor deposition.

BACKGROUND OF THE INVENTION

Typically, coated glass articles are produced by continuously coating a glass substrate while it is being manufactured in a process known in the art as the "Float Glass Process". This process involves casting glass onto a molten tin bath which is suitably enclosed, then transferring the glass, after it has sufficiently cooled, to take-away rolls which are aligned with the bath, and finally cooling the glass as it advances across the rolls, initially through a lehr and thereafter while exposed to the ambient atmosphere. A non-oxidizing atmosphere is maintained in the float portion of the process, while the glass is in contact with the molten tin bath, to prevent oxidation. An air atmosphere is maintained in the lehr. The chemical vapor deposition (CVD) of various coatings may be conveniently performed in the bath or the lehr, or even in the transition zone therebetween, by contacting the surface of the hot glass with chemical vapor-containing reactants which pyrolytically decompose to form the metal oxide coating. This, of course, requires that the chemical reactants have vaporization temperatures below their thermal decomposition temperatures. A number of metal-containing compounds exist which may be vaporized to prepare a metal oxide coating on glass by CVD technology. Of particular interest are tin compounds which are vaporized to form tin oxide coatings.

The desirable performance characteristics of certain metal oxide coatings, such as tin oxide coatings, on glass, for example, are low emissivity, low sheet resistance, high light transmittance, high infrared reflectivity, etc., and are improved by the incorporation of a dopant into the metal oxide coating. Among the materials used in the prior art as dopants is antimony. Typically, antimony has been supplied in the form of inorganic antimony compounds, such as an antimony halide, for example, $SbCl_3$.

The physical form of the reactants employed in glass coating processes is generally a liquid, solid, vaporized liquid or solid, liquid or solid dispersed in a carrier gas mixture, or vaporized liquid or solid dispersed in a carrier gas mixture. The chemical vapor deposition process generally employs a vaporized liquid or solid, which is typically dispersed in a carrier gas mixture.

U.S. Pat. No. 6,005,127 discloses an organoantimony Lewis base adduct which is said to be useful for Sb-ion implantation and formation of antimonide films, by various types of chemical vapor deposition. The present invention does not contain Lewis base adducts, nor does it involve ion implantation or formation of metal antimonides. Further, the '127 patent only discloses the following methods of chemical vapor deposition: chemical vapor deposition, assisted chemical vapor deposition (e.g., laser, light, plasma, ion, etc.).

It would be desirable to improve the heretofore known methods for applying an antimony doped tin oxide coating to a surface of a hot glass substrate by a CVD process, and thereby enhance the low sheet resistance and uniformity of the sheet resistance of the coated glass product, while at the same time minimizing the undesirable pre-reaction of precursor materials which occurs with known inorganic antimony dopants. It would also be desirable to provide a method for applying an antimony-doped tin oxide coating to a surface of a hot glass substrate which is less costly than the heretofore known methods.

SUMMARY OF THE INVENTION

The present invention is directed toward a chemical vapor deposition process for applying an antimony doped metal oxide coating to a surface of a hot glass substrate. Preferably, the metal is a tin compound. Most preferably, the tin compound is an organotin compound. Surprisingly, it has been discovered that the desirable properties of antimony doped metal oxide coatings, particularly tin oxide coatings, on glass, are improved by utilizing a process comprising:

A chemical vapor deposition process for applying an antimony doped metal oxide coating to a surface on a hot glass substrate, comprising:
 a) providing a hot glass substrate, including a surface upon which an antimony doped metal oxide coating is to be deposited;
 b) providing a uniform, vaporized reactant mixture containing a metal compound, an oxygen-containing compound, water, and an organoantimony compound which will not pre-react with said oxygen-containing compound or water at temperatures below 550° F.;
 c) delivering the vaporized reactant mixture to the surface of the hot glass substrate, and reacting the mixture to deposit a coating of antimony doped metal oxide on the surface of the hot glass substrate; and
 d) cooling the coated glass substrate to ambient temperature.

A source of oxygen is necessary for the process of the invention, and is preferably chosen from among air, gaseous oxygen and molecular oxygen.

In a preferred embodiment, a sodium diffusion barrier, preferably a layer of silica, is applied to the surface of the glass substrate prior to the deposition of the antimony doped metal oxide. The process of the present invention is particularly suitable for the production of glass having an antimony doped metal oxide coating, and is useful for energy efficient architectural windows, airplane or automobile windows, and a variety of optical and electronic devices.

Co-pending U.S. patent application Ser. No. 09/625,921 discloses an antimony doped tin oxide film deposited on, and adhering to a glass substrate, and a coating of fluorine doped tin oxide deposited on and adhering to the coating of antimony doped tin oxide. The resulting coated glass article has a high solar selectivity. U.S. patent application Ser. No. 09/625,921 is, herein, incorporated by reference in its entirety.

DETAILED DESCRIPTION OF THE PREFERRED EMBODIMENT

Metal oxide coatings, particularly tin oxide coatings doped with antimony, may be deposited onto the surface of a hot glass substrate by a process generally known in the art as chemical vapor deposition (CVD). In accordance with the process of the invention, the reactants are combined so as to form a uniform, vaporized reactant stream which is delivered to the surface of the hot glass substrate, wherein the vaporized reactant stream reacts to deposit a coating of antimony doped metal oxide on the surface of the hot glass substrate. In the oxidizing atmosphere, which must exist at the surface of the hot glass, organometallic compounds, preferably organotin coating compounds, pyrolytically decompose to form a metal/tin oxide coating.

The process is typically conducted during the manufacture of glass by the float glass process, and occurs in the float bath, the lehr, or in the transition zone between the bath and the lehr, while the glass is still hot. The glass substrate is generally provided at a temperature in the range from about 750° F. to about 1500° F. These are typical temperatures for glass during various stages as it is manufactured by the float glass process. More specifically, the coating process is conducted at temperature in the range of 900–1350° F., preferably in the range of 1100–1280° F.

The glass substrates suitable for use in the process according to the present invention include any of the conventional glass substrates known in the art for the preparation of coated glass articles. A typical glass substrate, used in the manufacture of vehicle windows and plate glass, is commonly referred to as soda-lime-silica glass. Other suitable glasses may be generally designated as alkali-lime-silica glass, boro-silicate glass, alumino-silicate glass, boro-alumino silicate glass, phosphate glass, fused silica, etc., as well as combinations thereof. A preferred glass is soda-lime-silica glass.

The CVD reactant stream of this invention preferably includes an organotin coating compound which is vaporized and conveyed to a point at or near the surface of the advancing glass ribbon. Suitable organotin compounds useful for practicing the invention include, without limitation to those specifically recited, dimethyltin dichloride, diethyltin dichloride, dibutyltin diacetate, tetramethyl tin, methyltin trichloride, triethyltin chloride, trimethyltin chloride, ethyltin trichloride, propyltin trichloride, isopropyltin trichloride, sec-butyltin trichloride, t-butyltin trichloride, phenyltin trichloride, carbethoxyethyltin trichloride, and the like, as well as combinations thereof. These compounds are generally well known in the art of CVD technology, as well as commercially available, as precursors for applying a tin oxide coating on hot glass. A preferred organotin compound is dimethyltin dichloride. The organotin compound, and optionally a carrier gas, oxidizer, stabilizer, hydrocarbon, inert gas, and the like, are vaporized to form a gaseous organotin reactant stream. The term gaseous organotin reactant stream, as used herein, typically comprises a vaporized organotin compound, an oxidizer, and an inert carrier gas.

The vaporized organotin compound may be prepared by any of the procedures generally known in the art, such as, for example, the vaporization of dispersed or fluidized, organotin powders, or the vaporization of organotin particles in a packed bed by a hot carrier gas stream, or the injection of a solubilized organotin compound into a hot carrier gas stream, or the bubbling of a carrier gas through a liquid organotin compound. A preferred method for preparing the reactant streams containing the vaporized organotin compounds is to vaporize the compound in a thin film evaporator in the presence of a blend gas, as is disclosed, for example, in U.S. Pat. No. 5,090,985, which is incorporated herein in its entirety by reference thereto. As noted above, this gaseous stream, which generally comprises an inert carrier gas such as helium, nitrogen, or argon, or mixtures thereof, may optionally contain oxidizers such as water or oxygen. Preferred carrier gases are helium and nitrogen, and mixtures thereof, containing oxygen as an oxidizer. The resultant reactant stream containing the vaporized organotin compound is generally heated to a temperature from about 250° F. to about 450° F., then conveyed to the reaction zone at the surface of the hot glass substrate, where temperatures at the face of the coater nearest the glass surface are less than or equal to approximately 550° F.

A separate reactant stream containing an organoantimony compound, an oxidizer, and an inert carrier gas is another component of the coating system of the invention.

The organoantimony compounds useful in the invention can be generally described by the formula:

$(R^1)_x Sb(R^2)_{3-x}$ where $R^1$ is an aryl group, $R^2$ is an alkyl group, and x=3 or 2 when, in the above formula, x=2, the family of compounds referred to are known as diaryl alkyl antimony compounds, which while suitable for use in the present invention are more likely to pre-react with oxygen, as will hereinafter be described in greater detail.

When, in the above formula, x=3, a preferred family of compounds, triaryl antimony compounds, are formed. Examples of such compounds are $(Mes)_3Sb$, where Mes is mesityl or 1, 3, 5 trimethylphenyl, $(Tolyl)_3Sb$, $Ph_3Sb$, and $(R_xC_6H_{5-x})_3Sb$ where R is a small chain organic group, having one to four carbon atoms, (i.e., $C_1$–$C_4$) and x=1–5. Of these, $Ph_3Sb$ is particularly preferred, for reasons which will hereinafter be discussed.

It has been found that few antimony compounds meet the requisite requirements of being highly reactive at deposition temperatures, but of not pre-reacting with water or oxygen, or being corrosive. The above-described triaryl antimony compounds have been found to meet these criteria and thus are preferred compounds in connection with the present invention. $Ph_3Sb$ is particularly preferred, because in addition to being a triaryl antimony compound having the desired properties described above, it is available in commercial quantities.

Unlike conventional inorganic antimony precursor materials such as $SbCl_3$, when $Ph_3Sb$ is used in conjunction with organotin reagents, water and oxygen, it remains stable, and does not pre-react, so detrimental Sb/O/Cl solid-state compounds are produced in negligible quantities. Materials such as $SbCl_3$ are known to be water-sensitive, and in addition to reacting with water to form the undesirable, non-volatile, solid-state compounds noted above, they are corrosive.

Such solid materials build up on the primary coating device, reducing coating efficiency, or in the worst case, actually causing the coating operation to be shut down completely. Using the air- and water-stable organoantimony precursors of the present invention will reduce operational downtime due to less frequent shut-downs for maintenance because of a build-up of Sb/O/Cl solids.

The organoantimony-containing reactant stream is combined with the organotin reactant stream at a point prior to delivery of the reactants to the surface of the hot glass substrate upon which the coating is to be deposited, but preferably in relatively close proximity thereto. The reactant stream containing the organoantimony may be prepared by vaporizing the compound using any suitable method, such as the methods discussed hereinabove relative to the vaporization of the organotin. The vaporized reactant stream containing the organoantimony may be combined with the reactant stream containing the vaporized organotin compound by blending the two gaseous streams prior to delivery to the surface of the hot glass substrate. Alternatively, the organoantimony-containing reactant stream in liquid or solution form may be injected into the hot reactant stream containing the vaporized organotin compound, thereby vaporizing the antimony-containing solution or liquid compound. After combination, the vaporized reactants of organotin, organoantimony, water and an oxygen-containing compound are delivered to the surface of the hot glass, where they react together to deposit thereon a coating of antimony doped tin oxide.

In a preferred embodiment, the organotin reactant stream is formed by vaporizing dimethyltin dichloride and an inert carrier gas, such as nitrogen, helium or a mixture thereof in an evaporator such as that described above. The resulting gaseous stream is then combined with gaseous oxygen. At the same time, $Ph_3Sb$ and water are vaporized, and the resulting gaseous reactant stream of organoantimony and water vapor is combined with the gaseous organotin reactant stream to form a uniform, gaseous reactant stream. The uniform, gaseous reactant stream is delivered to the surface of the hot glass substrate, wherein a coating of antimony doped tin oxide is deposited on the surface of the hot glass substrate. The uniform, gaseous reactant stream may be delivered to the surface of the glass by any suitable coating device. One preferred coating device is illustrated in U.S. Pat. No. 4,504,526, which is incorporated herein in its entirety by reference thereto.

The uniform, gaseous reactant mixture which is delivered to the surface of the hot glass substrate in accordance with the invention preferably includes (all percentages being mole %) from about 10 to about 60% oxygen, from about 2 to about 50% water, and from about 0.01% to about 4% organoantimony, and most preferably includes from about 10 to about 50% oxygen, from about 15 to about 35% water, and from about 0.01% to about 0.05% organoantimony. The uniform, gaseous reactant mixture also includes an organotin compound, the desired concentration of which is a function of the desired thickness of the tin oxide coating and the line speed of the substrate. Thus, as will be appreciated by those skilled in the art, the organotin is provided in the gaseous reactant mixture in an amount sufficient to apply a coating of the desired thickness at the desired line speed of the substrate. For typical commercial operations, the gaseous reactant mixture will generally include from about 0.01% to about 8% of the organotin.

It has also been noted to be preferable, when forming an antimony doped tin oxide coating in accordance with this invention, to apply a layer of a material which acts as a sodium diffusion barrier between the glass substrate and the antimony doped tin oxide coating. Coated glass articles have been found to exhibit lower emissivity, lower sheet resistance and lower haze when the antimony doped tin oxide coating deposited in accordance with the invention is applied to the glass with a sodium diffusion layer therebetween, as opposed to directly on the glass. This sodium diffusion layer is preferably formed of silica. The layer of silica is preferably formed using conventional CVD techniques.

In a more preferred embodiment, a thin film of tin oxide is first deposited on the surface of the hot glass substrate, with a thin film of silica deposited thereover, so that an underlayer structure of tin oxide/silica is formed intermediate the glass and the subsequently deposited layer of antimony doped tin oxide. In this embodiment, the silica film not only acts as a sodium diffusion barrier but, in combination with the first (undoped) tin oxide film, helps to suppress iridescence in the resulting coated glass article. The use of such anti-iridescent layers is disclosed in U.S. Pat. No. 4,377,613, which is incorporated herein in its entirety by reference thereto.

It must be noted that the process conditions are not sharply critical for the successful combining and delivering of vaporized reactants according to the present invention. The process conditions described hereinabove are generally disclosed in terms which are conventional to the practice of this invention. Occasionally, however, the process conditions as described may not be precisely applicable for each compound included within the disclosed scope. Those compounds for which this occurs will be readily recognizable by those ordinarily skilled in the art. In all such cases, either the process may be successfully performed by conventional modifications known to those ordinarily skilled in the art, e.g., by increasing or decreasing temperature conditions, by varying the rates of combination of the organotin and organoantimony reactants, by routine modifications of the vaporization process conditions, etc., or other process conditions which are otherwise conventional will be applicable to the practice of the invention.

It will also be noted that the process of the invention may be repeated as desired on a given substrate so as to form a coating consisting of several successive layers, the composition of each of the layers not necessarily being identical. It is, of course, obvious that for a given flow rate of the reactants, the thickness of a coating layer depends on the rate of movement of the substrate. Under these conditions, the reaction stations may, if desired, be multiplied by juxtaposing two or more coating devices. In this way, successive layers are superimposed before the layers have had time to cool, producing a particularly homogenous overall coating.

The invention is more easily comprehended by reference to specific embodiments which are representative of the invention. It must be understood, however, that the specific embodiments are provided only for the purpose of illustration, and that the invention may be practiced otherwise than as specifically illustrated without departing from its spirit and scope.

EXAMPLES

Examples 1 and 2

The following experimental conditions are applicable to Examples 1 and 2.

A laboratory furnace having a moving conveyor to move a glass sheet, or sheets, through said furnace at a rate of 200 inches/minute, also contains a single, 10-inch wide, bi-directional coater, the coater being suitable for conveying vaporized reactants to the surface of the glass sheets in order to form a film or film stack by chemical vapor deposition.

The glass sheets are heated to approximately 1170° F., while the coater, at the reactor face, i.e., the portion nearest the glass surface is at a temperature of approximately 500° F.

Preparation of the various precursor materials is accomplished by utilizing multiple source chambers known as "bubblers", there being a bubbler for each of ethyl acetate (EtOAc), triphenyl antimony ($Ph_3Sb$), and dimethyltin dichloride ($Me_2SnCl_2$), which are maintained at specific temperatures. Helium gas is introduced into the bubbler, at a particular flow rate.

The specific source or bubbler temperatures and the flow rates are as follows:

| Bubbler | EtOAc | $Ph_3Sb$ | $Me_2SnCl_2$ |
|---|---|---|---|
| Temperature | 97° F. | 465° F. | 355° F. |
| He Flow | 0.5–0.75 slm | 1.0 slm | 1.2 slm |

The prepared reactants are introduced into the laboratory coater along with oxygen ($O_2$) at a flow rate of 5.25 slm, and water ($H_2O$) at a flow rate of 12.4 slm.

The various reactants described above are combined in the coater to deposit an antimony-doped tin oxide coating on, in this case, a clear soda-lime-silica glass sheet whereon a $SiO_2$ layer 200 Å thick had previously been deposited.

| | Film Thickness | Sheet Resistance | $T_{vis}$ | $T_{sol}$ |
|---|---|---|---|---|
| Example 1 | 1951Å | 142 ohm/square | 63% | 48% |
| Example 2 | 2158Å | 119 ohms/square | 67% | 55% |

Film thicknesses were determined by profilometry.

$T_{vis}$ is the transmission of light in the visible portion of the spectrum (400 nm to 800 nm) through the coated glass.

$T_{sol}$ is the transmission of total solar radiation through the coated glass.

It should also be noted that He flow through the $EtOA_c$ bubbler was 0.75 slm in Example 1, and 0.50 slm in Example 2. Other parameters were as previously described for both examples.

The films produced by these tests are uniform in thickness and conductivity, exhibit low haze and good, selective solar absorption.

Example 3

It has also been found that acceptable antimony-doped tin oxide films may be produced by utilizing a solution of an aryl antimony compound, such as triphenyl antimony ($Ph_3Sb$), dissolved in ethyl acetate (EtOAc). Other suitable solvents include, but are not limited to, hexane, Toluene, dichloromethane, and acetonitrile. An inert gas is bubbled through gaseous dimethyltin dichloride ($Me_2SnCl_2$), as in Examples 1 and 2. Both reactant streams are combined with oxygen and water, as in Examples 1 and 2.

Laboratory furnace conditions and the coating device utilized for Example 3 are the same as for Examples 1 and 2.

Flow of the $Ph_3Sb$/EtOAc reactant stream, comprising 18% by weight, $Ph_3Sb$, at a flow rate of 11 cubic centimeters per minute, is combined with the reactant stream of $Me_2SnCl_2$ created by bubbling the gas at a flow rate of 1.2 slm through the gaseous $Me_2SnCl_2$, along with oxygen at a flow rate of 5.25 slm and water at a flow rate of 12.4 slm to produce a film on a soda-lime-silica substrate, having a pre-deposited 200 Å silica barrier layer thereon, the deposited film, having the following properties:

| | Film Thickness | Sheet Resistance | $T_{vis}$ | $T_{sol}$ |
|---|---|---|---|---|
| Example 3 | ≈2000Å | 135 ohms/square | 74% | 58% |

The invention has been disclosed in what is considered to be its preferred embodiment. It must be understood, however, that the specific embodiments are provided only for the purpose of illustration, and that the invention may be practiced otherwise than as specifically illustrated without departing from its spirit and scope.

What is claimed is:

1. A chemical vapor deposition process for applying an antimony doped tin oxide to a surface on a hot glass substrate, comprising:
   a) providing a hot glass substrate including a surface upon which an antimony doped tin oxide coating is to be deposited;
   b) providing a uniform, vaporized reactant mixture containing a tin compound, oxygen, water and an organoaritimony compound having at least one Sb—C bond and which will not undergo premature hydrolysis or oxidation at temperatures below 550° F., wherein said organoantimony compound is a compound of the form $(R^1)_xSb(R^2)_{3-x}$ where $R^1$ is an aryl group, $R^2$ is an alkyl group and x=3 or 2;
   c) delivering the vaporized reactant mixture to the surface of the hot glass substrate, wherein the uniform vaporized reactant mixture reacts to deposit a coating of antimony doped tin oxide on said surface of said hot glass substrate; and
   d) cooling the coated glass substrate to ambient temperature.

2. The process of claim 1, wherein said tin precursor is an organotin compound.

3. The process of claim 1, wherein said tin precursor is dimethyltin dichloride.

4. The process of claim 1, wherein said coating process takes place as part of a float glass production process.

5. The process of claim 4 wherein said coating process takes place in, or adjacent to, the float bath.

6. The process of claim 5 wherein said coating process occurs at a temperature of from 900–1350° F.

7. The process of claim 6, wherein said coating process occurs at a temperature from 1100–1280° F.

8. The process of claim 7, wherein said coating is deposited at a thickness of 1000 Å to 3500 Å.

9. The process of claim 6, wherein said coating is deposited at a thickness of 1000 Å to 5000 Å.

10. The process of claim 1, wherein a color suppressing coating is applied to the substrate upon which the antimony-containing coating is deposited prior to the deposition of said antimony-containing coating.

11. The process of claim 1, wherein said organoantimony compound is essentially non-reactive with water and oxygen.

12. A chemical vapor deposition process for applying an antimony doped metal oxide to a surface of a hot glass substrate, comprising:
   a) providing a hot glass substrate, including a surface upon which an antimony doped metal oxide coating is to be deposited;
   b) providing a sodium diffusion barrier layer and depositing same directly on said hot glass substrate;
   c) providing a uniform, vaporized reactant mixture containing a metal compound, an oxygen-containing compound, water and an organoantimony compound which will not pre-react with said oxygen-containing compound or water at temperatures below 550° F., wherein said organoantimony compound is a compound of the form $(R^1)_x Sb(R^2)_{3-x}$ where $R^1$ is an aryl group, $R^2$ is an alkyl group, and x=3 or 2;
   d) delivering the vaporized reactant mixture to the surface of the hot glass substrate; and reacting the mixture to deposit a coating of antimony doped metal oxide on the surface of the hot glass substrate; and
   e) cooling the coated glass substrate to ambient temperature.

13. The process of claim 12, wherein the sodium diffusion barrier layer comprises silica.

14. A chemical vapor deposition process for applying an antimony doped metal oxide coating to a surface on a hot glass substrate, comprising:
   a) providing a hot glass substrate, including a surface upon which an antimony doped metal oxide coating is to be deposited;
   b) providing a uniform, vaporized reactant mixture containing a metal compound, an oxygen-containing compound, water, and an organoantimony compound which will not pre-react with said oxygen-containing compound or water at temperature below 550° F., wherein said organoantimony compound is a compound of the form $(R^1)_x Sb(R^2)_{3-x}$ where $R^1$ is an aryl group, $R^2$ is an alkyl group, and x=3 or 2;
   c) delivering the vaporized reactant mixture to the surface of the hot glass substrate, and reacting the mixture to deposit a coating of antimony doped metal oxide on the surface of the hot glass substrate; and
   d) cooling the coated glass substrate to ambient temperature.

15. A chemical vapor deposition process for applying an antimony doped metal oxide coating to a surface on a hot glass substrate, comprising:
   a) providing a hot glass substrate, including a surface upon which an antimony doped metal oxide coating is to be deposited;
   b) providing a uniform, vaporized reactant mixture containing a metal compound, an oxygen-containing compound, water, and an organoantimony compound which will not pre-react with said oxygen-containing compound or water at temperatures below 550° F., wherein said organoantimony compound is a diaryl alkyl antimony compound;
   c) delivering the vaporized reactant mixture to the surface of the hot glass substrate, and reacting the mixture to deposit a coating of antimony doped metal oxide on the surface of the hot glass substrate; and
   d) cooling the coated glass substrate to ambient temperature.

16. A chemical vapor deposition process for applying an antimony doped metal oxide coating to a surface on a hot glass substrate, comprising:
   a) providing a hot glass substrate, including a surface upon which an antimony doped metal oxide coating is to be deposited;
   b) providing a uniform, vaporized reactant mixture containing a metal compound, an oxygen-containing compound, water, and an organoantimony compound which will not pre-react with said oxygen-containing compound or water at temperatures below 550° F., wherein said organoantimony compound is a triaryl animony compound chosen from the group consisting of: $(Mes)_3Sb$, $Ph_3Sb$, $(Toiyl)_3SB$, and $(R_xC_6H_{5-x})_3TSb$ (where R is a small chain organic group having one to four carbon atoms), and x=1–5;
   c) delivering the vaporized reactant mixture to the surface of the hot glass substrate, and reacting the mixture to deposit a coating of antimony doped metal oxide on the surface of the hot glass substrate; and
   d) cooling the coated glass substrate to ambient temperature.

17. A chemical vapor deposition process for applying an antimony doped metal oxide coating to a surface on a hot glass substrate, comprising:
   a) providing a hot glass substrate, including a surface upon which an antimony doped metal oxide coating is to be deposited;
   b) providing a uniform, vaporized reactant mixture containing a metal compound, an oxygen-containing compound, water, and an organoantimony compound which will not pre-react with said oxygen-containing compound or water at temperatures below 550° F., wherein said organoantimony compound is $Ph_3Sb$;
   c) delivering the vaporized reactant mixture to the surface of the hot glass substrate, and reacting the mixture to deposit a coating of antimony doped metal oxide on the surface of the hot glass substrate; and
   d) cooling the coated glass substrate to ambient temperature.

* * * * *